United States Patent [19]

Bodenhausen et al.

[11] Patent Number: 5,126,671
[45] Date of Patent: Jun. 30, 1992

[54] METHOD FOR EXCITING TRANSVERSE MAGNETIZATION IN NMR PULSE EXPERIMENTS

[75] Inventors: Geoffrey Bodenhausen, Pully; Jean-Marc Böhlen, Lausanne; Martial Rey, Renens, all of Switzerland

[73] Assignee: Spectrospin AG, Fallanden, Switzerland

[21] Appl. No.: 511,627

[22] Filed: Apr. 20, 1990

[30] Foreign Application Priority Data

Apr. 22, 1989 [EP] European Pat. Off. ........ 89107303.3

[51] Int. Cl.⁵ ............................................. G01R 33/20
[52] U.S. Cl. ..................................... 324/309; 324/314
[58] Field of Search ............... 324/307, 309, 311, 312, 324/314, 308

[56] References Cited

U.S. PATENT DOCUMENTS

| | | | |
|---|---|---|---|
| 3,975,675 | 8/1976 | Dunand et al. | 324/308 |
| 4,345,207 | 8/1982 | Bertrand et al. | 324/308 |
| 4,695,799 | 9/1987 | Hardy et al. | 324/311 |
| 4,906,932 | 3/1990 | Ordidge | 324/309 |
| 4,940,940 | 7/1990 | Leroux | 324/309 |
| 4,985,677 | 1/1991 | Pauly | 324/311 |

FOREIGN PATENT DOCUMENTS 0195404  3/1986  European Pat. Off. .

OTHER PUBLICATIONS

Journal of Magnetic Resonance. vol. 35, 1979, pp. 19-37, Academic Press, Inc., New York, U.S.; V. J. Basus et al.: "Utilization of chirp frequency modulation with 180 degrees-phase modulation for heteronuclear spin decoupling".

Journal of Magnetic Resonance, vol. 61, 1985, pp. 90-101, Academic Press, Inc., New York, U.S.; R. Tycko et al.: "Composite pulses without phase distortion".

Patent Abstracts of Japan, vol. 9, No. 167 (P-372) (1980), 12th Jul. 1985; and JP-A-60 044 880 (Yokohama Medical System K.K.) Nov. 3, 1985.

Journal of the American Chemical Society, vol. 110, 1988, pp. 5625-5628, American Chemical Society, Gaston, PA, U.S.; P. Pfändler et al.: "Broad-band two-dimensional fourier transform ion cyclotron resonance".

Primary Examiner—Hezron E. Williams
Assistant Examiner—Louis M. Arana
Attorney, Agent, or Firm—Cohn, Powell & Hind

[57] ABSTRACT

In NMR pulse experiments transverse magnetization is excited by irradiating the nuclear spin system with a two pulse sequence of a first RF chirp pulse and a second RF chirp pulse, generated after a defocusing time interval $\tau$. The pulse duration of the second chirp pulse is half the duration of the first pulse, and the amplitude of the second chirp pulse is approximately three times the amplitude of the first chirp pulse. The first pulse being a 90°-pulse, the second pulse being a 180°-pulse, a refocusing of the magnetization vectors occurs at a time $\tau' = \tau + \tau 180°$ after elapse of the second chirp pulse, and acquisition of the resulting echo signal is started at peak of the echo.

13 Claims, 5 Drawing Sheets

METHOD FOR EXCITING TRANSVERSE MAGNETIZATION IN NMR PULSE EXPERIMENTS

BACKGROUND OF THE INVENTION

The invention relates to a method for exciting transverse magnetization in NMR-experiments by irradiating the nuclear spin-system, which is subjected to a magnetic field of high field strength, with a sequence of RF-pulses to provide for a—substantially—phase-distortionless excitation followed by a free induction decay resulting in a spin-echo signal used for further processing and evaluation in terms of the physical quuantities or information of interest, said sequence of RF-pulses comprising a first RF-pulse providing for a 90° -flip, and a second RF-pulse, providing for a 180° -flip of the magnetization, each around an axis which is orthogonal to the direction of the magnetic field, the second RF-pulse being generated after elapse of a defocusing time interval $\tau$ following the first RF-pulse, as well as to NMR-spectroscopic devices which are operated by using the method according to the invention. A method of the above mentioned kind is known from the scientific publication by R. Freeman, S. P. Kempsell and M. H. Levitt, J. Magn. Reson. 38, 453 (1980).

According to the known method, the transverse magnetization is excited by a "spin-knotting sequence" consisting of a group of three pulses, a 10° (X) pulse, a 60° (−X) pulse, and a 140° (X) pulse, separated by suitable intervals, seen in a reference frame, rotating about the Z-axis in synchronism with the transmitter frequency, where the static magnetic field is directed along the Z-axis, and the transverse magnetization aligned along the Y-axis corresponds to an absorption mode signal.

A somewhat larger bandwidth of the spectral range within which transverse magnetization can be excited is obtained by pulse modulation of a fixed frequency carrier in combination with phase modulation (R. Tycko, H. M. Cho, E. Schneider and A. Pines, J. Magnetic Reson. 61, page 90, 1985), however, the improvement resulting therefrom is not of substantial importance.

Compared with usual practice to excite transverse magnetization in a NMR-experiment by merely applying a 90° pulse, the known methods provide for a considerable improvement with respect to phase-distortionless excitation. The bandwidth of the spectral range within which excitation of transverse magnetization is possible is, however, a comparably small interval, and the known methods, therefore suffer from the disadvantage that they are not effective to cover spectral ranges that are larger than the RF-amplitude, expressed in terms of the frequency $\omega = \gamma B_1$ which is equivalent ot the field contribution of the exciting RF.

The same holds for the situation prevailing in one- and multi-dimensional Fourier-Spectroscopy (R. R. Ernst, G. Bodenhausen and A. Wokaun, "Principles of Nuclear Magnetic Resonance in One and Two Dimensions", Clarendon Press, Oxford, 1987) according to which excitation in a frequency range of limited bandwidth is obtained by pulsed time modulation of a monochromatic transmitter-frequency.

On the other hand as it is well known, in continuous-wave (CW) spectroscopy (R. R. Ernst, Adv. Magn. Reson. 2, 1–135 (1966) it is possible to sweep the exciting transmitter frequency over spectra with arbitrary width. CW-spectroscopy, however, requiring a "slow" frequency-sweep suffers from the disadvantage of very long measuring times and, therefore, tends to be largely supplanted by Fourier-Spectroscopy.

If, to the object of reducing measuring time, continuous-wave spectra are recorded with a moderately fast frequency-sweep, one observes so-called "wiggles" in the spectra. In favourable cases, these artifacts my be removed by deconvolution (J. Dadok and R. F. Sprecher, J. Magn. Reson. 13, 243–248 (1974)), a method which has been called "Rapid Scan Fourier Transform Spectroscopy, by Gupta et al. (R. K. Gupta, J. A. Ferretti, and E. D. Becker, J. Magn. Reson. 13, 275–290 (1974)), since Fourier Transforms may be used very effectively to simplify the convolution integrals. In contrast to pulsed Fourier-Spectroscopy, however, the signal is recorded while the exciting RF-field is swept through the spectrum, exactly like in CW-spectroscopy.

A completely different approach to rapid-scan spectroscopy has been introduced by Delayre (J. Delayre, U.S. Pat. No. 3,975,675), according to which the magnetization is first excited by a frequency-swept pulse, a so-called "chirp pulse", as it is well-known per se in ion cyclotron resonance (ICR), where chirped pulses are employed in routine measurements (M. B. Comisarow und A. G. Marshall, Chem. Phys. Lett. 26, 489 (1974)), and their use has recently been extended to two-dimensional ICR spectroscopy (P. Pfändler, G. Bodenhausen, J. Rapin, M. E. Walser and T. Gäumann, J. Am. Chem. Soc. 110, 5625–5628 (1988)). In Delayre's experiment, in contrast to rapid-scan spectroscopy, the free induction decay is recorded after the end of the exciting chirp pulse. Due to the large frequency-dependent phase errors in the resulting spectra, Delayre's approach has never enjoyed much popularity in NMR.

SUMMARY OF THE INVENTION

It is, therefore, a primary object of the invention to provide a method for exciting transverse magnetization in a NMR-pulse experiment enabling both, excitation in a substantially arbitrary frequency range, and reliable compensation of phase-dispersion of an acquired spin-echo signal.

To this object, according to the invention, the first exciting pulse providing a 90° flip-angle, and the second exciting pulse, providing for a 180° flip-angle are chirp pulses within the duration of which the frequency of the exciting RF-pulse is swept in a monotonous relation with respect to time between a lower frequency $\omega_{RFmin}$ and an upper limit frequency $\omega_{RFmax}$, the duration of the second chirp pulse is half the duration of the first chirp pulse, and the amplitude of the second chirp pulse is between 2 times and 4 times the amplitude of the first chirp pulse.

By the chirp pulse sequence according to the invention the condition of a refocusing of the magnetization vectors to form a spin-echo is fulfilled, i.e., phase-distortions otherwise to be taken into account may be kept negligible over a very large bandwidth, the invention, therefore, combining the advantages of pulse spectroscopy techniques with those of CW spectroscopy.

The method according to the invention not being very sensitive to the amplitude of the second chirp pulse, most practical cases are covered by choosing for the ratio A 180°/A 90° a value between 2 and 4.

Acquisition of free induction decay signal following the second chirp pulse may be started immediately at the trailing edge of this pulse or, as it is preferable in some cases, at maximum intensity of the spin-echo signal in which case a spectrum obtained by Fourier transformation of the echo signal is essentially free of phase-dispersion.

In usual cases, the frequency sweep of the RF exciting radiation is linear with respect to time. In special cases it might be helpful, however, to provide for a non-linear but monotonous frequency sweep between the limiting frequencies $\omega_{RFmin}$ and $\omega_{RFmax}$.

In a preferred performance of the method according to the invention a four-step sequence of 90°–180° chirp pulse pairs is generated wherein the phase of the 90° pulse is the same as that of the RF-carrier frequency whereas the phase of the 180° chirp pulse is cycled through, 0°, 90°, 180° and 270° with respect to the phase of the RF-carrier frequency, and the phase of the receiver reference signal is alternately switched between 0° and 180° with respect to the phase of the RF-carrier frequency.

In this mode of performance of the method according to the invention a most effective elimination of any phase-dispersion is achieved.

The invention being useful for a variety of NMR pulse spectroscopy applications such as two-dimensional exchange spectroscopy, correlation spectroscopy, heteronuclear correlation spectroscopy, and multiple-quantum spectroscopy, it is understood that NMR pulse spectrometers having the said spectroscopic capabilities and being equipped with an installation enabling an operation mode in accordance with the invention are also regarded as subject matter of the invention.

Further details, aspects and advantages of the invention will be apparent from the following description of the invention with reference to the drawing wherein

Description of the Preferred Embodiments

Figure 1:
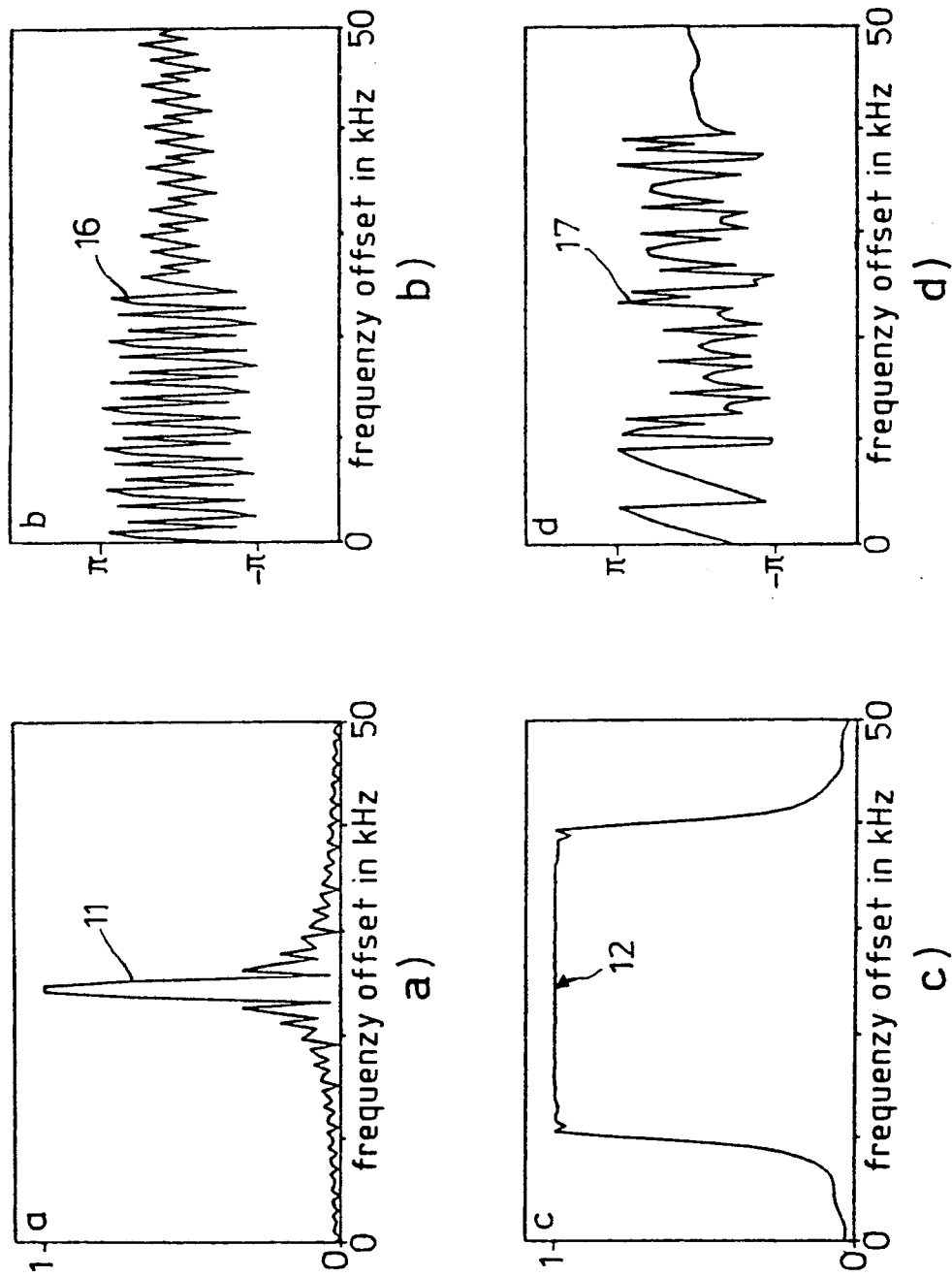
FIG. 1a shows the amplitude response for a conventional monochromatic 90° pulse, FIG. 1b the phase response of a conventional monochromatic 90° pulse, FIG. 1c the amplitude response following conventional chirp excitation, FIG. 1d the phase response following conventional chirp excitation, FIG. 1e the amplitude profile obtained with a spin-echo sequence using two chirp pulses, FIG. 1f the phase response resulting from excitation by two chirp pulses, FIG. 1g the amplitude response of an excitation by a chirp echo sequence in combination with a four-step phase-cycling in the manner of "Exorcycle", FIG. 1h the phase response obtained by refocused chirp excitation combined with Exorcycle, FIG. 2a the time-dependence of the RF amplitude of a typical chirp refocusing pulse sequence, FIG. 2b the time-dependence of the RF-frequency for a typical chirp refocusing sequence, FIG. 2c the time-dependence of the phases of three magnetization vectors at offsets of 75, 150 and 200 Hz with respect to the beginning of the sweep in a simulation which for the sake of clarity merely extends over 300 Hz, FIG. 3a a proton spectrum of a mixture of chloroform, methylenechloride, acetone, cyclohexane and dioxane, obtained after excitation by a single chirp pulse, FIG. 3b a spectrum of the same mixture of substances obtained with a chirp refocusing sequence, FIG. 3c a spectrum like that of the FIG. 3b, but with a fourstep Exorcycle to remove small phase imperfections, and FIG. 4 a block diagram of an NMR-spectrometer of the type for performing the method herein.
Figure 1:
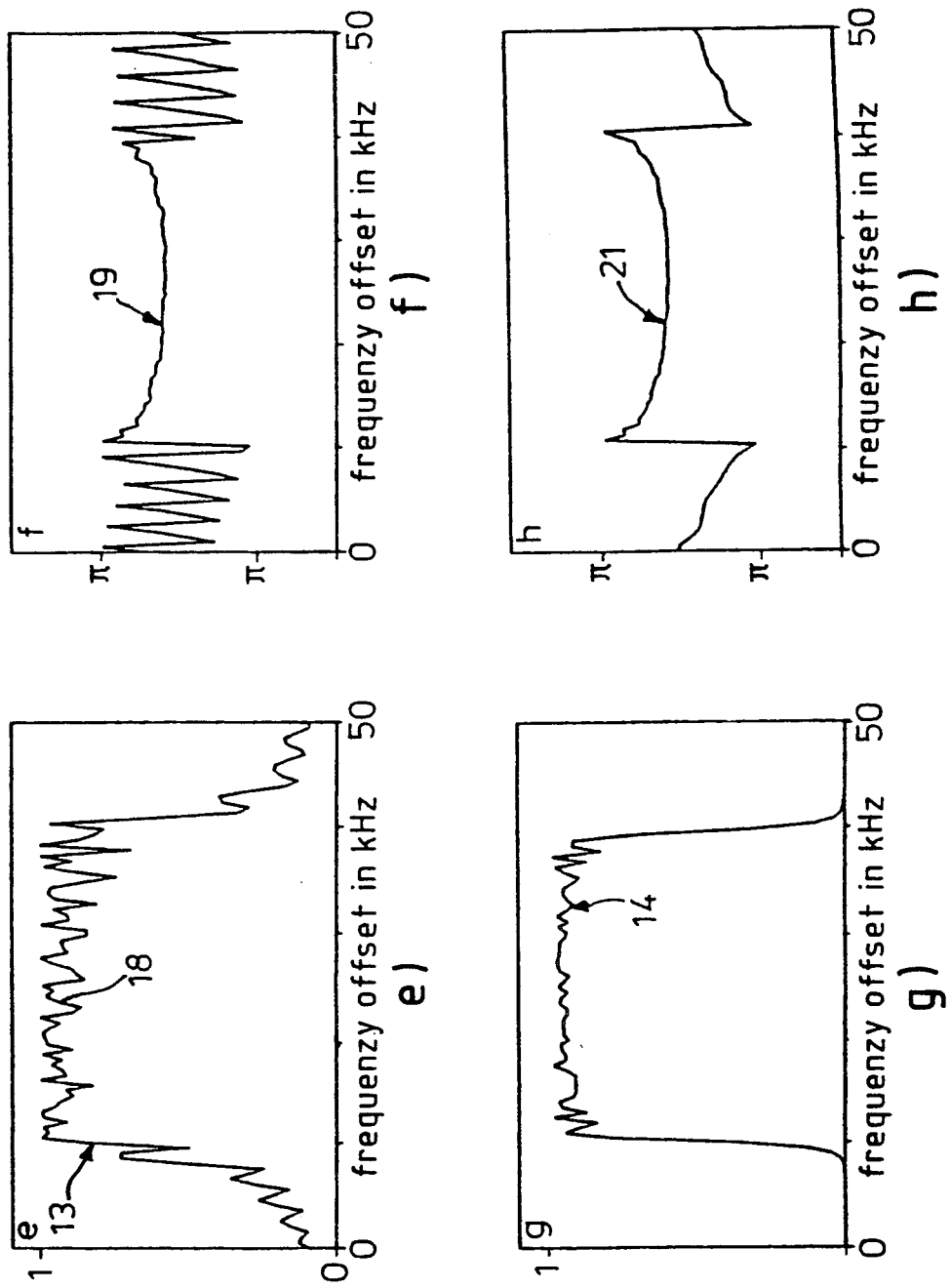

FIGS. 1a, 1c, 1e, and 1g show the offset dependence of the magnitude of the transverse magnetization, i.e. $M_{xy} = (M_x^2 + M_y^2)^{\frac{1}{2}}$, for a variety of NMR pulse experiments. For these experiments the FIGS. 1b, 1d, 1f, and 1h, respectively, show the offset dependence of the phase $\phi = \arctan(M_y/M_x)$ of the transverse magnetization as represented by FIGS. 1a–1g, calculated for that moment at which the signal acquisition must be initiated (either immediately after the RF pulse or at the time of the spin-echo). The apparent discontinuities in the phase diagrams (FIGS. 1b, 1d, 1f, and 1h, respectively) are due to the fact that the phases are plotted only in the interval $(-\pi, +\pi)$.

The amplitude responses 11, 12, 13 and 14 of the magnetization vectors were calculated by solving the Bloch equations numerically. For chirp pulses this can be done in an accelerating rotating frame that is synchronized with the instantaneous frequency $$\omega_{RF}(t) = \omega_{RFmin} + \Delta\omega_{RF} t/\tau_p,$$

where $\omega_{RFmin}$ is the minimum frequency used to excite a transverse magnetization, $\Delta\omega_{RF}$ is the range of the frequency sweep, and $\tau_p$ is the duration of the chirp pulse. In the said rotating frame, the effective field vector $B_{eff} = B_1 + \Delta B_0$, where $B_1$ is proportional to the amplitude of the exciting RF-field and $B_0$ the component resulting from the static magnetic field to which the nuclear spin system is exposed, initially points towards the north pole, i.e. in the Z-direction, and gradually moves in the yz-plane towards the south pole, briefly coinciding with the y-axis only when the frequency of the exciting RF field passes resonance.

FIG. 1a shows the amplitude response 11, and FIG. 1b the phase response 16 for a conventional monochromatic 90° exciting pulse with a carrier frequency of 25 kHz, a RF amplitude $\gamma B_1 = 340$ Hz and a duration $\tau_p = 750$ μs, wherein the RF amplitude is expressed in terms of the gyromagnetic ratio $\gamma$ and the field strength $B_1$ of the exciting pulse. This pulse excitation results in an amplitude response 11 with a $|\sin\omega/\omega|$ envelope in the frequency domain and a very steep frequency-dependent phase error. The apparent lack of symmetry in the phase response 16 is due to insufficient digitization. It is to be noted that the phase response 16 is essentially meaningless over much of the width shown in FIG. 1b, since the amplitude 11 is negligible except in the vicinity of the RF carrier frequency.

FIG. 1c shows the amplitude response 12, and FIG. 1d phase response 17, following conventional chirp excitation in a NMR pulse experiment which was carried out in the manner of Delayre's original experiment. The carrier frequency of the RF exciting pulse was swept from 10 kHz to 40 kHz. The intensity of the exciting pulse was the same as that of the pulse used in the experiment according to FIGS. 1a and 1b ($\gamma B_1 = 340$ Hz), and the pulse duration $\tau_p$ was 2 ms. These conditions were just chosen such that the magnetization was tipped from the north pole to the equatorial plane of the rotating frame, in analogy to the effect of a normal 90° pulse. The erratic response 17 according to FIG. 1d represents the phases of the signals in a spectrum obtained by Fourier transformation of a free induction decay acquired immediately after the end of the exciting pulse. It is seen that the frequency-dependence of the phase is so "steep" that a phase correction would be difficult.

FIG. 1e shows the amplitude profile obtained with a spin-echo sequence (90°-$\tau$-180°-$\tau'$-acquisition) using, according to the invention, two chirp pulses (details will be given below). In FIG. 1f the corresponding phase response 19 is shown.

The ripple 18 in the amplitude response 13 of FIG. 1e is due to imperfect refocusing.

This problem can be largely removed by generating chirp echo sequences according to the invention in a four-step phase-cycle in a manner known per se as "Exorcycle" (G. Bodenhausen, R. Freeman, and D. L. Turner, J. Magn. Reson. 27, 511-514 (1977), i.e. by incrementing the initial phase of the second chirp pulse in steps of $\pi/2$, and alternately adding and subtracting the signals. This procedure yields the smooth amplitude response 14 of FIG. 1g and the phase response 21 of FIG. 1h, which shows that the phase dispersion can be largely eliminated by combining refocusing and phase-cycling. To more completely explain the Exorcycle-method as used in combination with the invention, reference is made to the following table "chirp pulse refocusing + Exorcycle" showing for a sequence of four chirp pulse excitations the phase angles of the 90° chirp pulse, and of the receiver reference signal, each of which relative to the phase angle of the carrier frequency.

By adding the amplitude responses of the four chirp pulse echo sequences as listed in the table, the smooth amplitude response 14 of FIG. 1g is obtained.

TABLE

| | Chirp pulse refocusing + "Exorcycle" | | |
|---|---|---|---|
| Chirp echo | Chirp echo phase shift | with respect to carrier frequency | |
| sequence | 90° chirp pulse | 180° chirp pulse | receiver reference |
| (a) | 0° | 0° | 0° |
| (b) | 0° | 90° | 180° |
| (c) | 0° | 180° | 0° |
| (d) | 0° | 270° | 180° |

For the calculations shown in FIG. 1, the amplitude $\gamma B_1$ of the 90° chirp pulse(s) was 340 Hz, and the RF amplitude $\gamma B_2$ of the 180° chirp pulse(s) was 952 Hz.

Figure 2:
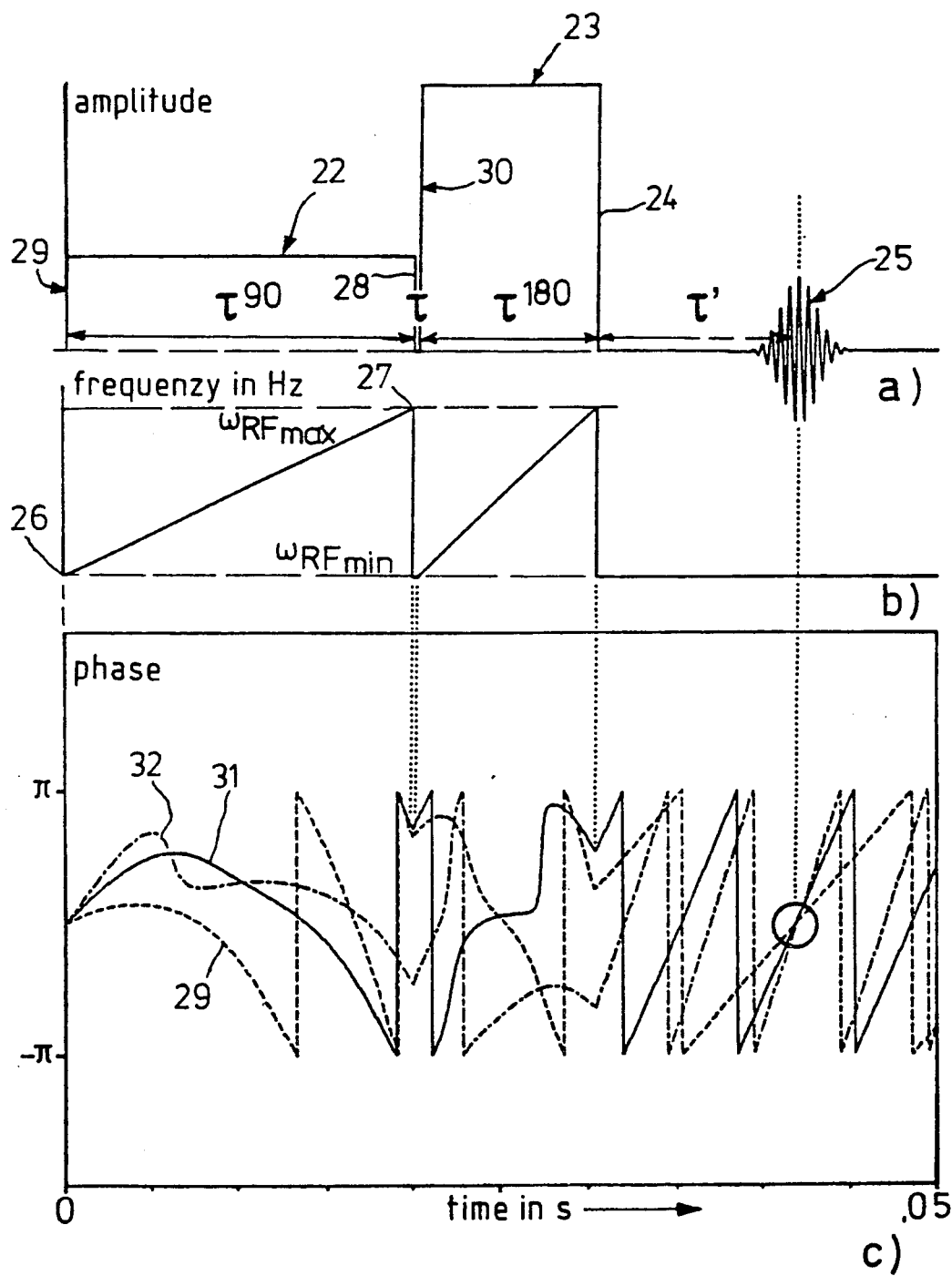

To more fully explain the chirp pulse excitation according to the invention, reference is next made to the details of FIGS. 2a, 2b, and 2c:

If chirp pulses, generally designated in FIG. 2 as 22 and 23, are used in echo sequences, the second pulse 23 must be half as long as the first pulse 22, as illustrated in FIG. 2a. The condition that the duration $\tau^{180}$ of the second chirp pulse 23 is half the duration $\tau^{90}$ of the first chirp pulse 22 ($\tau^{180} = \tau^{90}/2$) implies that within the second pulse the frequency must be swept twice as fast as within the first pulse 22, as shown schematically in FIG. 2b in which, on the same time base as that of FIG. 2a the frequency of the chirp pulses is represented by the ordinate. As it is shown in FIG. 2a an echo signal is formed at time $\tau' = \tau + \tau^{180}$ after the trailing edge 24 of the second chirp pulse 23.

As shown in FIG. 2a, the defocusing interval $\tau$ can be very short ($\tau = 300$ $\mu$s in both experiments and simulations). The requirement that the two chirp pulses 22 and 23 should have different durations $\tau^{90}$ and $\tau^{180}$ can be understood from the following explanation: consider a magnetization vector precessing with a frequency $\omega_{RFmin}$ at the "lower" end 26 of the sweep, this vector will be brought into the transverse plane at the very beginning 29 of the experiment, and precess essentially freely during the interval $\tau^{90} + \tau$. It will be affected by the second pulse 23 at its very beginning 30 and will then need a time $\tau^{90} + \tau$ to refocus, so as to contribute to the echo 25 at a time $\tau' = \tau^{90} + \tau - \tau^{180}$ after the end 24 of the second pulse 23. On the other hand, a vector with a frequency $\omega_{RFmax}$ at the "upper" end 27 of the sweep will only be brought into the transverse plane at the end 28 of the first pulse 22, and then defocus for a time $\tau + \tau^{180}$, since it will only be affected by the trailing edge 24 of the second pulse 23. This vector will therefore refocus at a time $\tau^{180} + \tau$ after the end 24 of the second pulse. The two echo contributions will be synchronized provided $$\tau^{180} = \tau^{90}/2.$$

A more accurate picture of the echo formation is given in FIG. 2c, where the time-dependence of the phases of three typical magnetization vectors, at offsets of 75 Hz (dashed line 29), 150 Hz (solid line 31), and 200 Hz (dash-dotted line 32) with respect to the beginning of the sweep, is shown in the accelerating rotating frame described above. For the sake of clarity, in the simulation represented by FIG. 2c, the sweep merely extends over 300 Hz. The time-derivative of a trajectory in FIG. 2c corresponds to the instantaneous offset frequency. The frequency at which the frame rotates is suddenly switched from $\omega_{RFmax}$ to $\omega_{RFmin}$ after the end of each pulse 22 and 23. This is reflected in a sharp change in sign of the slope of the trajectories 29, 31, and 32, respectively. The other apparent discontinuities in FIG. 2c are simply due to the fact that the phases are plotted in the interval $(-\pi, +\pi)$. Despite of these complications, it is easy to see that the trajectories 29, 31, and 32 of the three vectors converge at the time of the echo 25, where the acquisition of the signal is started.

If frequency-swept pulses 22 and 23—chirp pulses—are used it is not sufficient to double the RF amplitude to double the effective flip angle. Thus if a value $\gamma B_1^{90}$ is required for a pulse of length $\tau p$ to achieve a rotation $I_z \rightarrow I_x$, the value $\gamma B_1^{180}$ required for adiabatic inversion ($I_z \rightarrow -I_z$) in the same duration $\tau p$ must be about three times larger $\gamma B_1^{180} \approx 3 \gamma B_1^{90}$). To optimize the conditions for refocusing (e.g. for converting $I_x \rightarrow -I_x$), numerical simulations have been carried out. For the pulse sequence 22, 23 of FIG. 2a, it was found that the second pulse 23 must have an amplitude of 2.8 times the amplitude of the first pulse.

Figure 3:
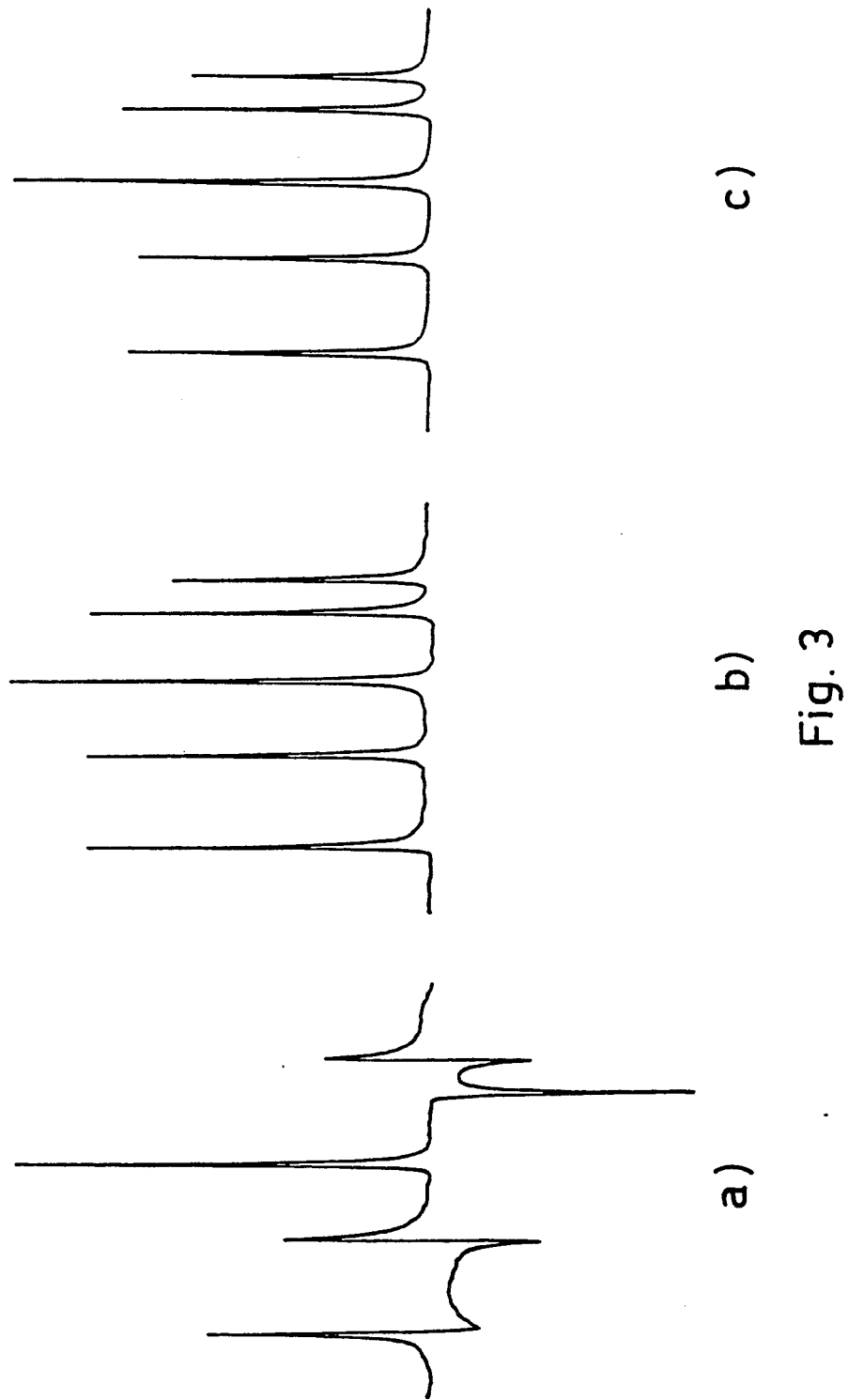

To compare chirp spectroscopy with and without refocusing, proton spectra of a mixture of chloroform, methylene chloride, acetone, cyclohexane, and dioxane were recorded with a modified Bruker WH 360 spectrometer. FIG. 3a shows the conventional chirp spectrum obtained with Delayre's technique by sweeping once through the spectrum, recording the free induction decay after the end of the sweep, and Fourier transforming without any phase corrections. The signals appear between 14 and 17 kHz from the initial frequency of the sweep which runs from 0 to 30 kHz. The phases are so strongly frequency-dependent that a phase-correction is very difficult.

FIG. 3b shows a spectrum of the same sample obtained with the chirp refocusing sequence 22, 23, where the pulse lengths of the 90° and 180° pulses 22 and 23 were 20 ms and 10 ms, respectively, and where the amplitudes had a ratio of about 1:3. The de- and refocusing intervals $\tau$ and $\tau'$ were 300 $\mu$s and 10.31 ms, respectively (the latter was optimized empirically to account for propagation delays in the receiver system). All signals are in pure absorption, although only a frequency-independent phase correction has been applied. The very small remaining phase imperfections can be further removed by using a four-step Exorcycle as explained above to obtain the spectrum as shown in FIG. 3c, which is substantially free of phase-distortions.

The frequency was swept by driving five decades of a binary-coded decimal (BCD) input of a Program Test Source PTS 500 frequency synthesizer with the output of a TTL counter driven by a 5 MHz clock frequency, which can be switched to 10 MHz for the refocusing pulse. The synthesizer output was swept in 20 or 10 ms from 400 to 500 kHz, divided by 10, added to 120 MHz and multiplied by three in the final amplifier, so that the final sweep covered 30 kHz from 360.120 to 360.150 MHz. Using the proton decoupler of a Bruker WH 360 spectrometer, the attentuation levels of the first and second pulses 22 and 23 were 11 and 0 dB, respectively. The actual ratio of the RF amplitude was about 1:3. The outcome of the experiment is not critically dependent on this ratio, particularly if "Exorcycle" is used. The proton spectra were recorded using the sturdy decoupler coil of a 10 mm carbon-13 probe as transmitter/receiver coil.

Chirp pulses appear to be very promising for covering large bandwidths, such as encountered in NMR at very high magnetic fields or in paramagnetic solutions.

Installations enabling performance of the method according to the invention, i.e. excitation of transverse magnetization by means of chirp pulses 22 and 23 will be of advantage in spectrometers adapted to perform two-dimensional exchange spectroscopy ("NOESY"), correlation spectroscopy ("COSY"), heteronuclear correlation spectroscopy, and multiple-quantum spectroscopy which are sensitive to large offsets and also in NMR imaging experiments and especially in NMR-tomography.

Figure 4:
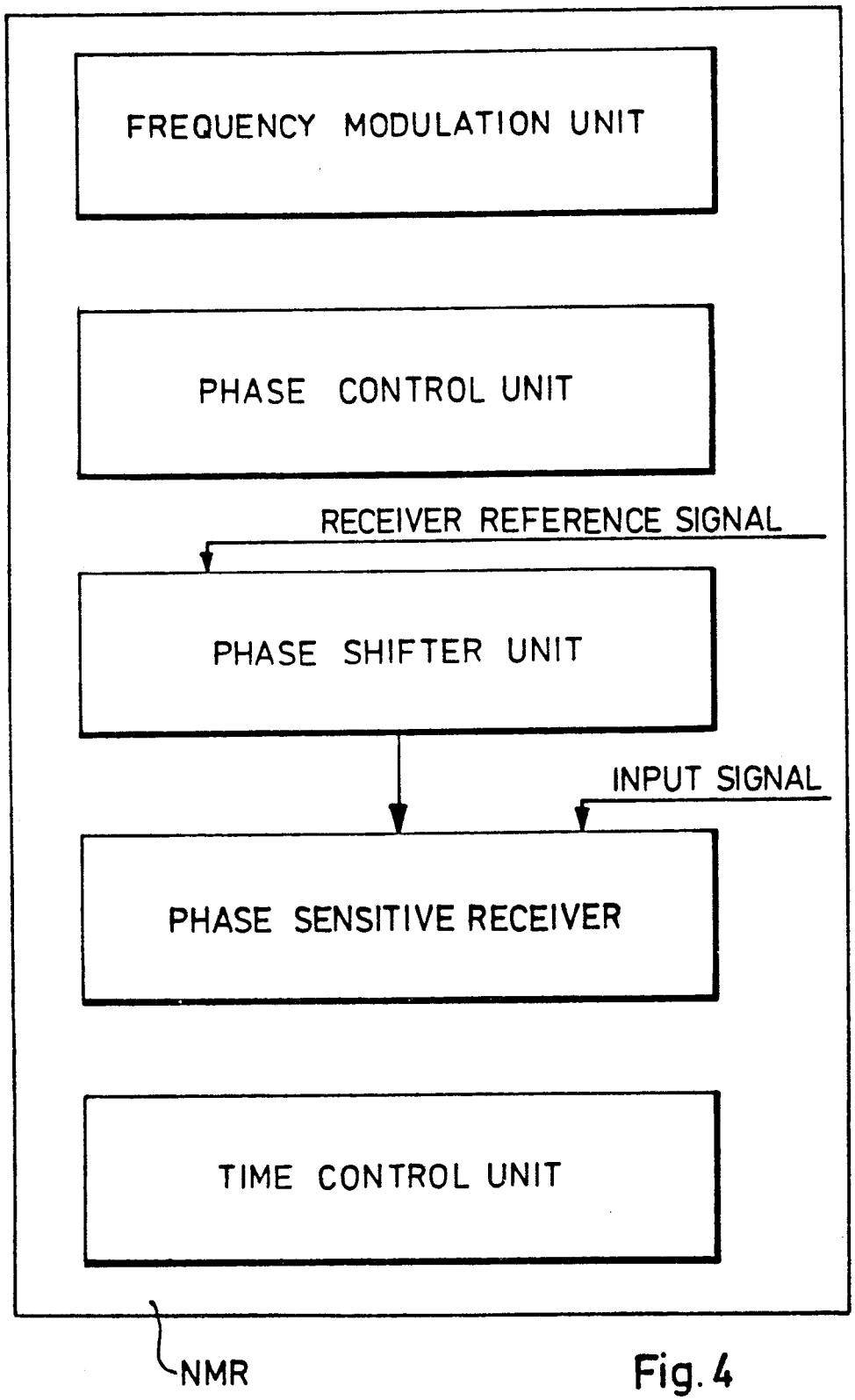

FIG. 4 illustrates in block diagram form, an NMR-spectrometer, especially for performing the method according to claim 1. As shown, the spectrometer comprises a frequency modulation unit designed to provide for a fast frequency sweep of the RF-electromagnetic radiation field used for the excitation of a transverse magnetization in an NMR experiment, said frequency swept excitation field being adjustable with respect to sweep rate, RF-amplitude, and sweep repetition. The spectrometer further comprises a phase control unit, designed to enable adjustment of phase shifts of the excitation field with respect to the carrier frequency, by frequency modulation of which the exciting field frequency range is defined, and a phase shifter unit enabling adjustment of a phase shift between the input signal of a phase sensitive receiver and the receiver reference signal which is kept in a strong phase relationship with respect to the RF carrier frequency. The spectrometer also comprises a time-control unit adapted to control generation of a first exciting RF chirp pulse (22) and of a second exciting RF chirp pulse (23) in a 90°-180° refocusing sequence and to initiate acquisition of the resulting free induction decay signal at the latest at maximum level of the resulting spin-echo signal.

According to an analoguous modification of the method according to the invention, the sequence of chirp pulses 22, 23, as shown in FIG. 2a is inverted, i.e., the 180°-pulse 23 of the pulse form shown in FIG. 2a is generated as the first pulse and, thereafter, the 90° pulse 22 of the pulse form shown in FIG. 2a is generated.

This inverted sequence of chirp pulses is of interest if, e.g., a transverse magnetization is to be converted into a longitudinal magnetization.

It is intended such a modification also belonging to the subject matter of the invention and being comprised by the scope of the claims.

The reference numerals in the claims are not a restriction.

We claim:

1. A method for exciting transverse magnetization in NMR pulse experiments by irradiating the nuclear spin system subjected to a magnetic field of high field strength with at least one sequence of RF-pulses to provide for a substantially-phase-distortionless excitation followed by a free induction decay resulting in a spin-echo signal used for further processing and evaluation in terms of the physical quantities or information of interest, said sequence of RF-pulses comprising a first RF-pulse providing for a 90°-flip, and a second RF-pulse providing for a 180°-flip of the magnetization, each around an axis which is orthogonal to the direction of the magnetic field, the second RF-pulse being generated after elapse of a defocusing time interval $\tau$ following the first RF-pulse, wherein the first exciting pulse (22) and the second exciting pulse (23) are chirp pulses within the duration of which the frequency of the exciting RF-energy is swept in a monotonous relation with respect to time between a lower limit frequency $\omega_{RFmin}$ to an upper limit frequency $\omega_{RFmax}$, the duration $\tau^{180°}$ of the second chirp pulse (23) is half the duration $\tau^{90°}$ of the first chirp pulse (22), and the amplitude of the second chirp pulse (23) is between 2 and 4 times the amplitude of the first chirp pulse (22).

2. The method according to claim 1, wherein the amplitude of the second chirp pulse (23) is about 2.8 times the amplitude of the first chirp pulse (22).

3. The method according to claim 1, wherein acquisition of the free induction decay (FID)-signal is started at maximum level of the spin-echo signal (25) and the acquired signal data are evaluated by Fourier transform (FT)-techniques.

4. The method according to claim 1, wherein the frequency of the exciting RF pulses is swept from the lower limit frequency to the higher limit frequency in a linear relationship with respect to time.

5. The method according to claim 1, wherein acquisition of the spin-echo signal comprises at least four acquisition cycles (a,b,c, and d) within each of which a refocusing chirp pulse sequence (22, 23) is generated, and the spin-echo is acquired by phase sensitive receiver with the pulse carrier frequency as receiver reference signal, in the first acquisition cycle (a) the second chirp pulse (23) being generated with a zero-phase shift with respect to the carrier frequency, and the receiver being operated also with a zero-phase shift between the pulse carrier frequency and the receiver reference signal, in the second acquisition cycle (b) the second chirp pulse (23) being generated with a 90° phase shift with respect to the carrier frequency, and the receiver being operated with a 180° phase shift between the carrier frequency and the receiver reference signal, in the third acquisition cycle (c) the second chirp pulse (23) being generated with a 180° phase shift with respect to the carrier frequency, and the receiver being operated again at zero-phase shift between the carrier frequency and the receiver reference signal, and in the forth aquisition cycle (d) the second chirp pulse (23) being generated with a 270°-phase shift with respect to the carrier frequency, and the receiver being operated again with a 180°-phase shift between the carrier frequency and the receiver reference signal, the first chirp pulses (22) always being generated with a zero-phase shift with respect to the carrier frequency, and wherein the acquisitions obtained by the four acquisition cycles (a, b, c and d) are added, and the sum of these acquisitions is used for further processing and evaluation.

6. A method for exciting transverse magnetization in NMR pulse experiments in a two-dimensional exchange spectrometer by irradiating the nuclear spin system subjected to a magnetic field of high field strength with at least one sequence of RF-pulses to provide for a—substantially—phase-distortionless excitation followed by a free induction decay resulting in a spin-echo signal used for further processing and evaluation in terms of the physical further processing and evaluation in terms of the physical quantities or information of interest, said sequence of RF-pulses comprising a first RF-pulse providing for a 90°-flip, and a second RF-pulse providing for a 180°-flip of the magnetization, each around an axis which is orthogonal to the direction of the magnetic field, the second RF-pulse being generated after elapse of a defocusing time interval $\tau$ following the first RF-pulse,
wherein the first exciting pulse (22) and the second exciting pulse (23) are chirp pulses within the duration of which the frequency of the exciting RF-energy is swept in a monotonous relation with respect to time between a lower limit frequency $\omega_{RFmin}$ to an upper limit frequency $\omega_{RFmax}$,
the duration $\tau^{180°}$ of the second chirp pulse (23) is half the duration $\tau^{90°}$ of the first chirp pulse (22), and the amplitude of the second chirp pulse (23) is between 2 and 4 times the amplitude of the first chirp pulse (22).

7. A method for exciting transverse magnetization in NMR pulse experiments in a homonuclear correlation spectrometer by irradiating the nuclear spin system subjected to a magnetic field of high field strength with at least one sequence of RF-pulses to provide for a—substantially—phase-distortionless excitation followed by a free induction decay resulting in a spin-echo signal used for further processing and evaluation in terms of the physical further processing and evaluation in terms of the physical quantities or information of interest, said sequence of RF-pulses comprising a first RF-pulse providing for a 90°-flip, and a second RF-pulse providing for a 180°-flip of the magnetization, each around an axis which is orthogonal to the direction of the magnetic field, the second RF-pulse being generated after elapse of a defocusing time interval $\tau$ following the first RF-pulse,
wherein the first exciting pulse (22) and the second exciting pulse (23) are chirp pulses within the duration of which the frequency of the exciting RF-energy is swept in a monotonous relation with respect to time between a lower limit frequency $\omega_{RFmin}$ to an upper limit frequency $\omega_{RFmax}$,
the duration $\tau^{180°}$ of the second chirp pulse (23) is half the duration $\tau^{90°}$ of the first chirp pulse (22), and the amplitude of the second chirp pulse (23) is between 2 and 4 times the amplitude of the first chirp pulse (22).

8. A method for exciting transverse magnetization in NMR pulse experiments in a heteronuclear correlation spectrometer by irradiating the nuclear spin system subjected to a magnetic field of high field strength with at least one sequence of RF-pulses to provide for a —substantially— phase-distortionless excitation followed by a free induction decay resulting in a spin-echo signal used for further processing and evaluation in terms of the physical further processing and evaluation in terms of the physical quantities or information of interest, said sequence of RF-pulses comprising a first RF-pulse providing for a 90°-flip, and a second RF-pulse providing for a 180°-flip of the magnetization, each around an axis which is orthogonal to the direction of the magnetic field, the second RF-pulse being generated after elapse of a defocusing time interval $\tau$ following the first RF-pulse,
wherein the first exciting pulse (22) and the second exciting pulse (23) are chirp pulses within the duration of which the frequency of the exciting RF-energy is swept in a monotonous relation with respect to time between a lower limit frequency $\omega_{RFmin}$ to an upper limit frequency $\omega_{RFmax}$,
the duration $\tau^{180°}$ of the second chirp pulse (23) is half the duration $\tau^{90°}$ of the first chirp pulse (22), and the amplitude of the second chirp pulse (23) is between 2 and 4 times the amplitude of the first chirp pulse (22).

9. A method for exciting transverse magnetization in NMR pulse experiments in a multiple-quantum spectrometer by irradiating the nuclear spin system subjected to a magnetic field of high field strength with at least one sequence of RF-pulses to provide for a—substantially—phase-distortionless excitation followed by a free induction decay resulting in a spin-echo signal used for further processing and evaluation in terms of the physical further processing and evaluation in terms of the physical quantities or information of interest, said sequence of RF-pulses comprising a first RF-pulse providing for a 90°-flip, and a second RF-pulse providing for a 180°-flip of the magnetization, each around an axis which is orthogonal to the direction of the magnetic field, the second RF-pulse being generated after elapse of a defocusing time interval $\tau$ following the first RF-pulse,
wherein the first exciting pulse (22) and the second exciting pulse (23) are chirp pulses within the duration of which the frequency of the exciting RF-energy is swept in a monotonous relation with respect to time between a lower limit frequency $\omega_{RFmin}$ to an upper limit frequency $\omega_{RFmax}$,
the duration $\tau^{180°}$ of the second chirp pulse (23) is half the duration $\tau^{90°}$ of the first chirp pulse (22), and the amplitude of the second chirp pulse (23) is between 2 and 4 times the amplitude of the first chirp pulse (22).

10. A method for exciting transverse magnetization in NMR pulse experiments in an NMR-imaging tomograph by irradiating the nuclear spin system subjected to a magnetic field of high field strength with at least one sequence of RF-pulses to provide for a—substantially—phase-distortionless excitation followed by a free induction decay resulting in a spin-echo signal used for further processing and evaluation in terms of the physical further processing and evaluation in terms of the physical quantities or information of interest, said sequence of RF-pulses comprising a first RF-pulse providing for a 90°-flip, and a second RF-pulse providing for a 180°-flip of the magnetization, each around an axis which is orthogonal to the direction of the magnetic field, the second RF-pulse being generated after elapse of a defocusing time interval τ following the first RF-pulse, wherein the first exciting pulse (22) and the second exciting pulse (23) are chirp pulses within the duration of which the frequency of the exciting RF-energy is swept in a monotonous relation with respect to time between a lower limit frequency $\omega_{RFmin}$ to an upper limit frequency $\omega_{RFmax}$, the duration $\tau^{180°}$ of the second chirp pulse (23) is half the duration $\tau^{90°}$ of the first chirp pulse (22), and the amplitude of the second chirp pulse (23) is between 2 and 4 times the amplitude of the first chirp pulse (22).

11. The method according to claim 5, wherein the amplitude of the second chirp pulse (23) is about 2.8 times the amplitude of the first chirp pulse (22), wherein acquisition of the free induction decay (FID)—signal is started at maximum level of the spin-echo signal (25) and the acquired signal data are evaluated by Fourier transform (FT)—techniques and wherein the frequency of the exciting RF pulses is swept from the lower limit frequency to the higher limit frequency in a linear relationship with respect to time.

12. An NMR-spectrometer, comprising a frequency modulation unit designed to provide for a fast frequency sweep of the RF-electromagnetic radiation field used for the excitation of a transverse magnetization in an NMR experiment, said frequency swept excitation field being adjustable with respect to sweep rate, RF-amplitude, and sweep repetition, and further comprising a phase control unit, designed to enable adjustment of phase shifts of the excitation field with respect to the carrier frequency, by frequency modulation of which the exciting field frequency range is defined, and a phase shifter unit enabling adjustment of a phase shift between the input signal of a phase sensitive receiver and the receiver reference signal which is kept in a strong phase relationship with respect to the RF carrier frequency, and a time-control unit adapted to control generation of a first exciting RF chirp pulse (22) and of a second exciting RF chirp pulse (23) in a 90°-180° refocusing sequence and to initiate acquisition of the resulting free induction decay signal at the latest at maximum level of the resulting spin-echo signal.

13. A method for converting a transverse magnetization into a longitudinal magnetization in NMR pulse experiments by irradiating the nuclear spin system subjected to a magnetic field of high field strength with at least one sequence of RF-pulses to provide for a—substantially—phase-distortionless conversion, said sequence of RF-pulses comprising a first RF-pulse providing for a 180°-flip of the magnetization, and a second RF-pulse for a 90°-flip of the magnetization, each around an axis which is orthogonal to the direction of the magnetic field, the second RF-pulse being generated after elapse of a defocusing time interval τ following the first RF-pulse, the first exciting pulse and the second exciting pulse being chirp pulses within the duration of which the frequency of the exciting RF-energy is swept in a monotonous relation with respect to time between a lower limit frequency ωRFmin to an upper limit frequency ωRFmax, the duration $\tau^{180°}$ of the first chirp pulse being half the duration $\tau^{90°}$ of the second chirp pulse, and the amplitude of the first chirp pulse being between 2 and 4 times the amplitude of the second chirp pulse.

* * * * *